(12) United States Patent
Aoki

(10) Patent No.: US 8,040,675 B2
(45) Date of Patent: Oct. 18, 2011

(54) OPTICAL MODULE

(75) Inventor: Shin-ichi Aoki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 659 days.

(21) Appl. No.: 12/216,436

(22) Filed: Jul. 3, 2008

(65) Prior Publication Data

US 2009/0010653 A1   Jan. 8, 2009

(30) Foreign Application Priority Data

Jul. 6, 2007 (JP) .................................. 2007-178907

(51) Int. Cl.
*H05K 7/20* (2006.01)
(52) U.S. Cl. ........ 361/707; 361/704; 361/709; 361/714; 361/715; 257/718; 257/719
(58) Field of Classification Search .................. None
See application file for complete search history.

(56) References Cited

U.S. PATENT DOCUMENTS

| 6,617,518 | B2 * | 9/2003 | Ames et al. | 174/254 |
|---|---|---|---|---|
| 6,696,643 | B2 * | 2/2004 | Takano | 174/520 |
| 6,696,755 | B2 * | 2/2004 | Kami et al. | 257/728 |
| 7,154,752 | B2 * | 12/2006 | Sato et al. | 361/715 |
| 7,311,240 | B2 * | 12/2007 | Nippa et al. | 228/180.1 |
| 7,365,923 | B2 * | 4/2008 | Hargis et al. | 359/820 |
| 7,668,215 | B2 * | 2/2010 | Scofet et al. | 372/36 |
| 2005/0206293 | A1 | 9/2005 | Taomoto et al. | |

FOREIGN PATENT DOCUMENTS

| JP | 7-21308 | 5/1995 |
|---|---|---|
| JP | 2003-198026 | 7/2003 |
| JP | 3763078 | 1/2006 |

* cited by examiner

*Primary Examiner* — Boris Chervinsky
(74) *Attorney, Agent, or Firm* — Staas & Halsey LLP

(57) ABSTRACT

According to an aspect of the embodiment, an optical module includes a case, an optical transceiver part in the case, a radiating part on the case; a thermal conductive sheet having a property of transferring and having a first end and second end; a first fixing part for fixing the first end of the thermal conductive sheet to the optical transceiver unit; and a second fixing part for fixing the second end of the thermal conductive sheet to the radiating point.

5 Claims, 8 Drawing Sheets

OPTICAL MODULE

CROSS-REFERENCE TO RELATED APPLICATION

This application is based upon and claims the benefit of priority of the prior Japanese Patent Application No. 2007-178907, filed on Jul. 6, 2007, the entire contents of which are incorporated herein by reference.

BACKGROUND

1. Field

This art relates to an optical module to be used for optical communication. For example, the optical module can implement stable operations of the optical module by allowing efficient heat radiation of an optical transceiver part.

2. Description of the Related Art

In recent years, increases in speed and density of optical modules to be used for optical communication have been greatly advanced. The increases in speed and density of optical modules can contribute to increases in speed and sophistication while making the measures for the heat-radiation of the optical modules difficult. This is because the increase in speed increases the power consumption of parts installed in an optical module and greatly increases the amount of generated heat and the decrease in size optimizes the layout of parts to the limit, which prevents the sufficient allocation of the space for the heat radiation.

The technology for suppressing the increase in temperature of an optical module is disclosed in Japanese Laid-open Patent Publication No. 2003-198026 (Patent Document 1), for example. The technology disclosed in Patent Document 1 suppresses the increase in temperature of an optical module by sandwiching a radiating material between an electronic substrate that may control the optical module, for example, and the cabinet of an electronic machine in the electronic machine to which the optical module is attached, which allows the transmission of the heat generated by parts on the electronic substrate to the optical module.

However, the technology disclosed in Patent Document 1 may not be a measure for the heat radiation of an optical module itself. A technology that allows stable heat radiation of an optical module itself is being strongly demanded since an optical transceiver part that exchanges optical signals in the optical module has a temperature-dependent characteristic.

FIG. 9A is a diagram showing an example of the configuration of a conventional optical module. An optical module 10 shown in the figure includes a housing 101a and a cover 101b so as to form a case, an electronic substrate 102, an optical transceiver part 103, a fixing member 104, a screw 105 and a silicon sheet 106.

The housing 101a and cover 101b are a case for protecting parts installed in the optical module 10. The electronic substrate 102 is a driving circuit for the optical transceiver part 103. The optical transceiver part 103 is a part that performs one or both of the transmission and reception of an optical signal to be used for optical communication and includes a laser element and/or a photodiode, for example. The optical transceiver part 103 connects to an optical fiber for optical communication through an optical connector 20.

The fixing member 104 is a member for fixing the optical transceiver part 103 to the cabinet 101a and is screwed to the cabinet 101a with the screw 105 with the optical transceiver part 103 between the fixing member 104 and the cabinet 101a. The silicon sheet 106 is a sheet of silicon between the optical transceiver part 103 and the cabinet 101b.

FIG. 9B is a diagram showing the optical transceiver part 103, which is viewed from the direction of the point of vision V1. As shown in the figure, the silicon sheet 106 is in contact with the optical transceiver part 103 in a wide area. Furthermore, since silicon has a better thermal conductivity of 5 W/K*m, the silicon sheet 106 efficiently transfers the heat caused in the optical transceiver part 103 to a radiating point 101c on the cabinet 101b, which suppresses the increase in temperature of the optical transceiver part 103.

However, the conventional optical module 10 has problems that the optical axis may be displaced and/or that the optical transceiver part 103 may be damaged. In order to sufficiently radiate the heat caused in the optical transceiver part 103, the silicon sheet 106 must be tightly in contact with the optical transceiver part 103 and the cabinet 101b, and the silicon sheet 106 must be as thin as possible. For that reason, the cabinet 101b must be assembled into the cabinet 101a with high pressure such that the silicon sheet 106 can be pressed against the optical transceiver part 103 strongly.

For example, if the silicon sheet 106 is a general silicon sheet with an Asker-C hardness of about 30, the pressure of about 0.25 MPa must be applied thereto for a compression rate of 20%. The permissible pressure against an optical transceiver part such as the optical transceiver part 103 is about 65 kPa, and the pressure above is much higher than the permissible pressure. Therefore, the pressure for assembling the cabinet 101b into the cabinet 101a may sometimes damage the optical transceiver part 103.

Even when the optical transceiver part 103 is not damaged, the pressure for assembling the cabinet 101b into the cabinet 101a may move the optical transceiver part 103 fixed at an optimum place by adjusting the optical axis in advance and displace the optical axis, which may cause insufficient optical transmission power and/or a serious problem like the disability of transmission/reception of optical signals.

SUMMARY

It is an object of an aspect of the embodiment of the present invention to provide an optical module that can efficient heat radiation.

According to an aspect of the embodiment of the invention, an optical module includes a case, an optical transceiver part in the case, a radiating part on the case; a thermal conductive sheet having a property of transferring and having a first end and second end; a first fixing part for fixing the first end of the thermal conductive sheet to the optical transceiver unit; and a second fixing part for fixing the second end of the thermal conductive sheet to the radiating point.

Additional objects and advantages of the embodiment will be set forth in part in the description which follows, and in part will be obvious from the description, or may be learned by practice of the invention. The object and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

DESCRIPTION OF THE PREFERRED EMBODIMENTS

Hereinafter, embodiments according to the present invention will be described with reference to drawings.

Figure 1A:
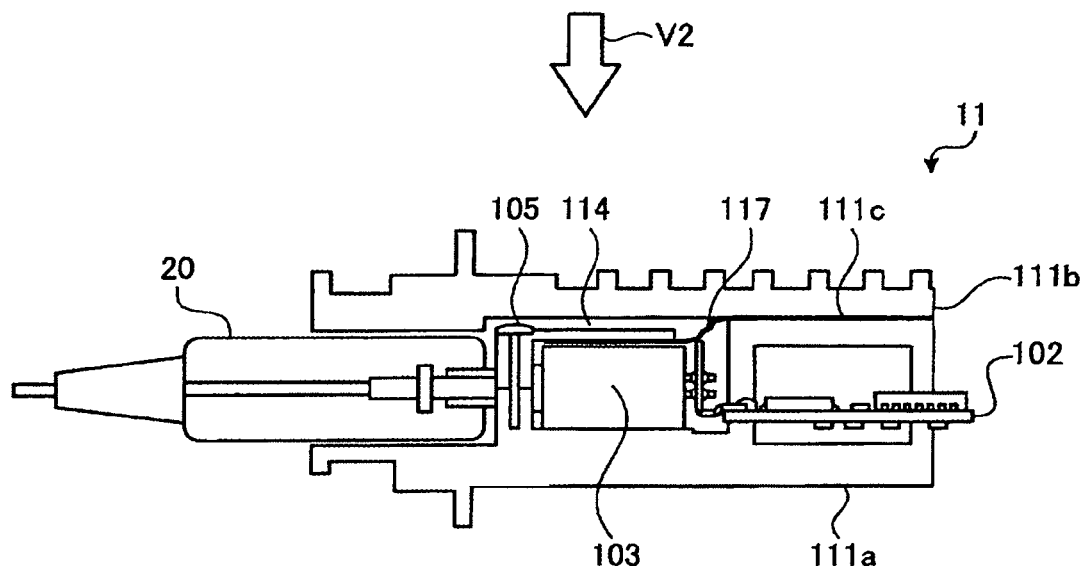
FIG. 1A is a diagram showing the configuration of an optical module according to an embodiment.

An optical module 11 according to this embodiment will be described. In the following descriptions, the same reference numerals are given to the same components as those in the already described configuration, and detail descriptions thereon will be omitted. FIG. 1A is a diagram showing the configuration of the optical module 11. As shown in the figure, the optical module 11 includes cabinets 111a and cover 111b, an electronic substrate 102, an optical transceiver part 103, a fixing member 114, a screw 105 and a thermal conductive sheet 117.

The electronic substrate 102 is a driving circuit for the optical transceiver part 103. The optical transceiver part 103 is a part that performs one or both of the transmission and reception of an optical signal to be used for optical communication and includes a laser element and/or a photodiode, for example. The optical transceiver part 103 connects to an optical fiber for optical communication through an optical connector 20.

The housing 111a and cover 111b are a case for protecting parts installed in the optical module. The fixing member 114 is a member for fixing the optical transceiver part 103 to the housing 111a and is screwed to the housing 111a with the screw 105 with the optical transceiver part 103 between the fixing member 114 and the housing 111a. The thermal conductive sheet 117 is sandwiched between the fixing member 114 and the optical transceiver part 103 such that the optical transceiver part 103 can be always in contact with the thermal conductive sheet 117.

Figure 1B:
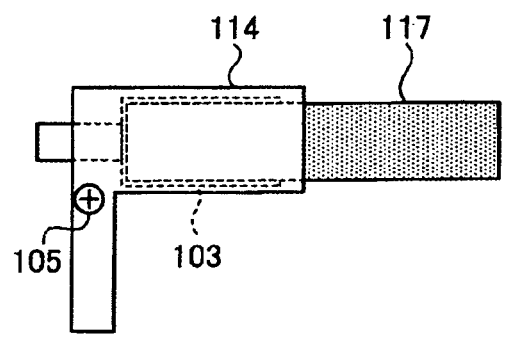
FIG. 1B is a diagram showing an optical transceiver part, which is viewed from the direction of the point of vision V2.

The thermal conductive sheet 117 is a sheet with a significantly high thermal conductivity and is placed within the optical module 11 so as to be in contact with the optical transceiver part 103 and a radiating point 111c on the cabinet cover 111b. FIG. 1B is a diagram showing the optical transceiver part 103, which is viewed from the direction of the point of vision V2. As shown in the figure, the thermal conductive sheet 117 is in contact with the optical transceiver part 103 in a wider area. The thermal conductive sheet 117 is also in contact with the radiating point 111c in a wider area. In the example shown in FIG. 1A, the structure in which the thermal conductive sheet 117 is sandwiched between the cabinets 111a and cover 111b allows the thermal conductive sheet 117 to be in contact with the radiating point 111c in a fixed manner. However, the thermal conductive sheet 117 may be in contact with the radiating point 111c by using some fixing member.

With the recent advance of material technologies, a high heat-conductivity sheet (such as a graphite sheet) with a higher thermal conductivity than that of metal has been developed, and the thermal conductive sheet 117 is preferably such a high heat-conductivity sheet. A high heat-conductivity sheet has a superior thermal conductivity as high as 800 W/K*m or higher in the plane direction and 20 W/K*m or higher in the thickness direction and may often be used as a material for diffusing the heat caused by a part into a wider area efficiently by using the higher thermal conductivity in the plane direction.

In the optical module 11, the thermal conductive sheet 117 is used for transferring the heat caused in the optical transceiver part 103 to the radiating point 111c provided at a part away from the optical transceiver part 103. As described above, a high thermal conductivity sheet has a significantly high thermal conductivity in the plane direction, that is, the direction horizontal to the surface. Therefore, by using a high thermal conductivity sheet as the thermal conductive sheet 117, the heat caused in the optical transceiver part 103 can be transferred to the radiating point 111c sufficiently efficiently even when the optical transceiver part 103 and the radiating point 111c are apart.

Since a high thermal conductivity sheet has a higher thermal conductivity than that of a silicon sheet also in the thickness direction as described above, the heat caused in the optical transceiver part 103 can be transferred to the thermal conductive sheet 117 sufficiently by using a high thermal conductivity sheet as the thermal conductive sheet 117, even when the pressure for sandwiching the thermal conductive sheet 117 between the optical transceiver part 103 and the fixing member 114. Therefore, the optical transceiver part 103 can be protected from damaging by keeping 65 kPa, which is a general permissible pressure of an optical transceiver part such as the optical transceiver part 103, and problems such as a displacement of the optical axis due to the application of pressure thereto can be prevented. Furthermore, the optical module 11 is configured to have a space between the fixing member 114 and the cabinet cover 111b. In this configuration, even when a high pressure is required for assembling the cabinets 111a and cover 111b, the pressure is not transferred to the optical transceiver part 103. Therefore, damages on the optical transceiver part 103 and/or problems such as a displacement of the optical axis may not occur even when the cabinets 11a and 11b are assembled.

In this way, since the optical module 11 is configured such that the thermal conductive sheet 117 with a high thermal conductivity can transfer the heat caused in the optical transceiver part 103 to the radiating point 111c provided at a part away from the optical transceiver part 103, the heat caused in the optical transceiver part 103 can be radiated efficiently without applying a high pressure to the optical transceiver part 103.

Since the thermal conductive sheet 117 is highly flexible in this configuration, the radiating point may be provided at an arbitrary position advantageously. Where the radiating point is to be provided on a cabinet is one important matter in radiation design, but the position where the radiating point can be placed may be limited under other various limitations and requirements. The transfer of heat in the optical transceiver part 103 to the radiating point through the thermal conductive sheet 117 can increase the degree of freedom in radiation design, keeping sufficient radiation performance.

Figure 2:
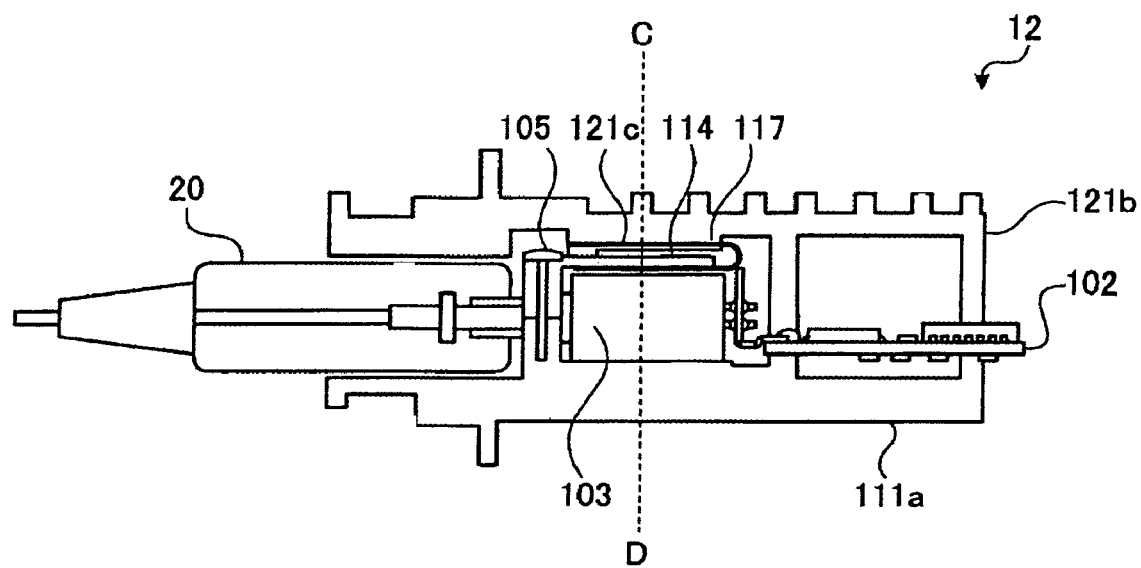
FIG. 2 is a diagram showing the configuration of an optical module having a thermal conductive sheet folded into a U-shape.

Notably, while FIG. 1A shows the example in which the optical transceiver part 103 and the radiating point 111c are apart, a radiating point may be provided near the optical transceiver part 103. FIG. 2 shows an example showing the configuration of an optical module 12 having the thermal conductive sheet 117 folded in a U-shape. As shown in the figure, a radiating point 121c on a cover 121b is provided directly above the optical transceiver part 103 in the optical module 12, and the thermal conductive sheet 117 folded to a U-shape is fixed to the cabinet 121b in order to transfer the heat caused in the optical transceiver part 103 to the radiating point 121c.

In this way, fixing the thermal conductive sheet 117 folded to a U-shape into the cabinet 121b reduces the length of the thermal conductive sheet 117 and increases the efficiency of the heat transfer and requires a small radiating space. Notably, in this configuration, the thermal conductive sheet 117 is preferably folded in a permissible limit curvature in order to reduce the length of the thermal conductive sheet 17 as much as possible. The cabinet 121b and the fixing member 114 are preferably spaced apart in order to prevent the application of large pressure to the optical transceiver part 103 when the cabinet 121b is assembled into the housing 111a.

Figure 3:
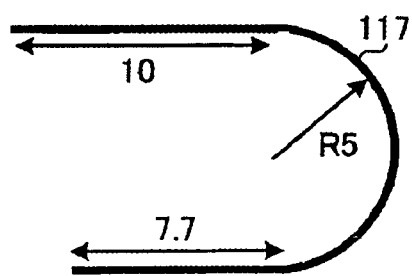
FIG. 3 is a diagram showing a model for heat-calculation.

Now, an example of the result of heat-calculations in the optical module 12 shown in FIG. 2 will be described. The assumed conditions for the heat calculation are as follows. The amount of caused heat in the optical transfer part 103, which is a heat source, is 1.5 W, and the width of the thermal conductive sheet 117 is 10 mm. The thermal conductive sheet 117 is folded to a U-shape, as shown in FIG. 3, such that the contact part with the optical transfer part 103 can be 7.7 mm, the contact part with the cabinet 121b can be 10 mm, and the radius of the folded part can be 5 mm. In this case, the length of the thermal conductive sheet 117 is assumed as being equal to about 24.55 mm at the center of the thickness. The thermal conductivity in the plane direction of the thermal conductive sheet 117 is assumed as being equal to 1600 W/K*m, and the thermal conductivity in the thickness direction is assumed as being equal to 20 W/K*m.

The difference in temperature between the optical transceiver part 103 and the radiating point 121c can be calculated by:

$$\text{Difference in Temperature} = \text{Thermal Resistance} \times \text{Amount of Heat} \quad \text{[EQ1]}$$

The thermal resistance required for obtaining the difference in temperature can be calculated by:

$$\text{Thermal Resistance} = 1/(\text{Thermal Conductivity} \times \text{Heat Transfer Area/Length}) \quad \text{[EQ2]}$$

However, regarding the difference in temperature, the temperature in deference between the back and front of the thermal conductive sheet 117 must be considered. The thermal resistance between the back and front of the thermal conductive sheet 117 is calculated as 0.65° C./W by EQ2. Here, focusing on the point that the thermal resistance and the length are in a proportional relationship in EQ2, the thermal resistance per unit area at a position at a depth t from the radiating surface of the optical transceiver part 103 is calculated as 0.65 t. Since the thermal conductive sheet 117 is placed in a U-shape in this model, the surface with which the radiating surface of the optical transceiver part 103 is in contact and the surface with which the radiating point 121c on the cabinet 121b is in contact are the same. Furthermore, considering the radiating path in consideration of the anisotropy of the thermal conductivity of the thermal conductive sheet 117, the depth for returning to the radiating point by the heat transferred to the depth t may be considered as t. In other words, the synthesized resistance at an arbitrary depth t is 1.3 t° C./W.

The longitudinal heat transfer of the thermal conductive sheet 117 will be examined next. The heat transfer area depends on the thickness of a sheet and the width of the sheet. The thermal resistance is 1.53° C./W based on EQ2 where the overlapped thickness of the thermal conductive sheet 117 is 1 mm. From the result above, the synthesized resistance of the thermal resistance through the depth t is 1.3t+1.53. Integrating this by the depth t, the entire synthesized resistance is 2.18° C./W since the integral interval is 0 to 1. Furthermore, multiplying this result by the amount of heat of an optical part provides a difference in temperature of 3.27° C.

The difference in temperature is a value that is a sufficiently suitable for practical use though the difference in temperature is calculated from the representative property value when invented. It can be understood from the calculations that the longitudinal heat transfer area may be increased or the thermal conductivity may be increased in order to decrease the difference in temperature. Increasing the thickness is effective for increasing the longitudinal heat transfer area, and using a material with a higher thermal conductivity is required for increasing the thermal conductivity.

Next, variation examples of the optical module 11 shown in FIG. 1A will be illustrated. The variation examples and the already described configurations of the optical modules 11 and 12 may be used in combination.

Figure 4A:
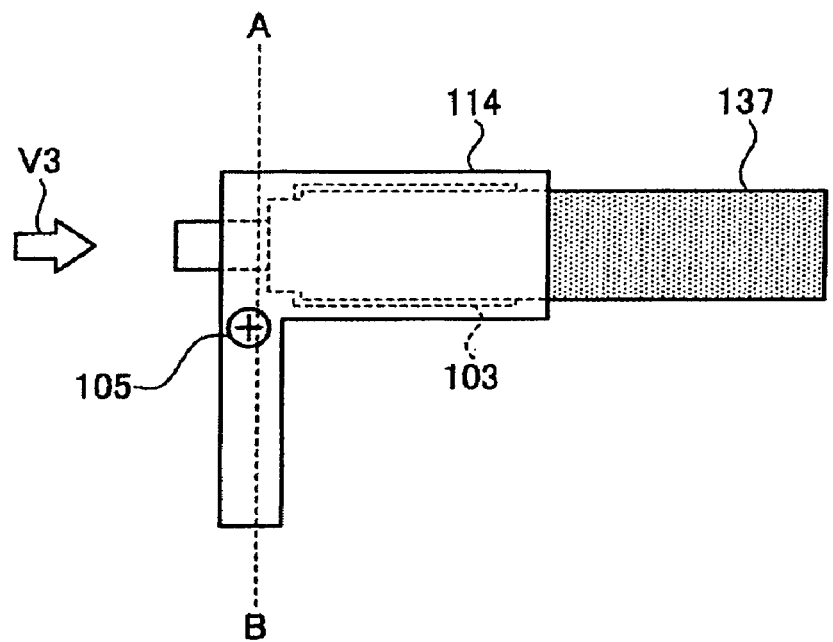
FIG. 4A is a diagram showing a structure preventing the removal of the thermal conductive sheet.
Figure 4B:
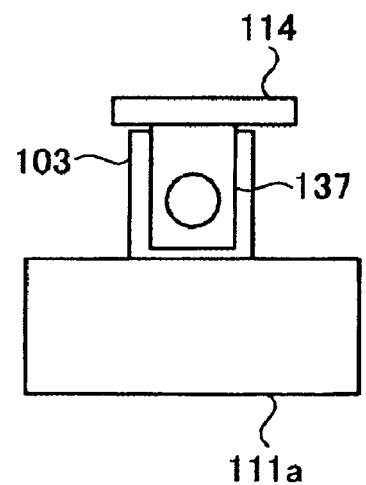
FIG. 4B is a diagram showing the optical transceiver part, which is viewed from the direction of the point of vision V3.

FIG. 4A is a diagram showing a structure for preventing the removal of a thermal conductive sheet 137. The thermal conductive sheet 137 shown in the figure has a circular hole near the pointed end. Then, as shown in FIG. 4B, which is viewed from the point of vision V3, the thermal conductive sheet 137 is fixed by the fixing member 114 with a cylindrical member on the optical transceiver part 103 through the hole for physically connecting the optical connector 20. In this structure, the state that the thermal conductive sheet 137 is not in contact with the optical transceiver part 103 resulting from the removal of the thermal conductive sheet 137 can be prevented even under the application of the tensile stress to the thermal conductive sheet 137 when the cabinets 111a and cover 111b are assembled.

Figure 5:
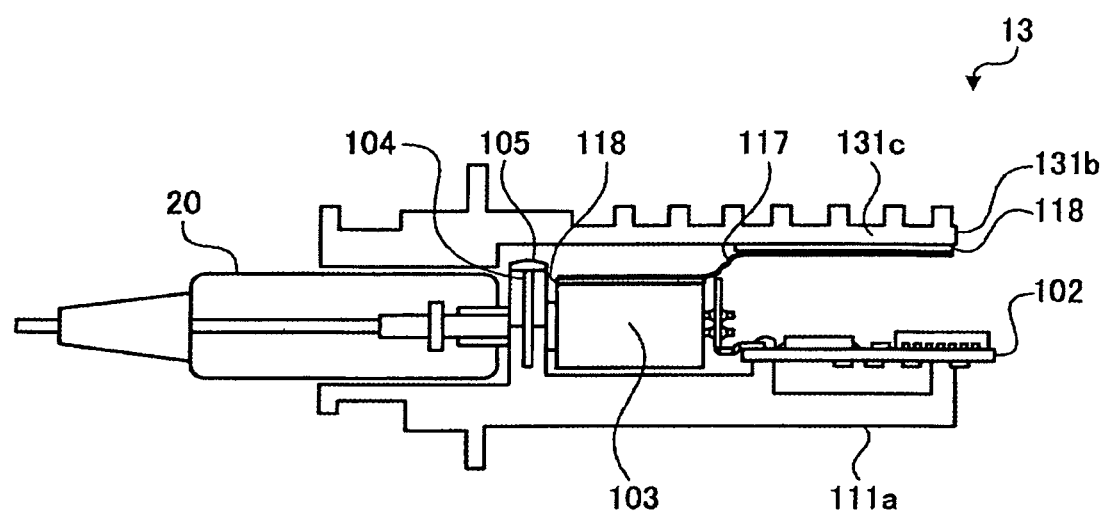
FIG. 5 is a diagram showing an optical module to which a thermal conductive sheet is fixed with an adhesive.

FIG. 5 is a diagram showing an optical module 13 to which the thermal conductive sheet 113 is fixed with an adhesive. The example shown in the figure illustrates an example in which the thermal conductive sheet 117 is fixed to the optical transceiver part 103 and a radiating point 131c on a cover 131b with an adhesive 118. By fixing the thermal conductive sheet 117 with an adhesive in this way, the structure can be more simplified and the assembly work can be easier than those of the case where a mechanical system such as screwing fixes the thermal conductive sheet 117.

Notably, in this case, the adhesive 118 has preferably a superior thermal conductivity in order to avoid decreases in thermal conductivity and is preferably spread thin to the limit under which the strength for fixing the thermal conductive sheet 117 is not insufficient. The thermal conductive sheet 117 may be fixed with an adhesive tape instead of the adhesive 118.

Figure 6A:
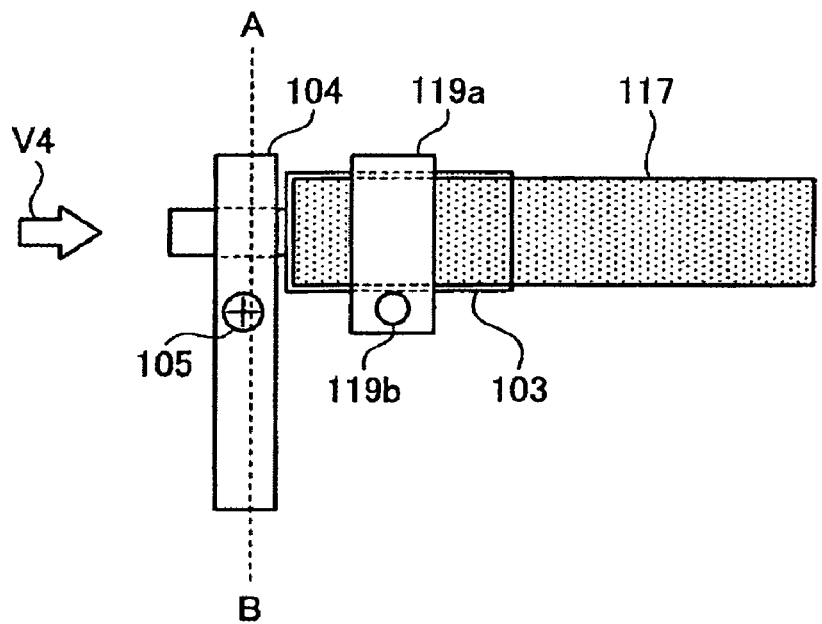
FIG. 6A is a diagram showing an example having a fixing member for fixing a thermal conductive sheet to an optical transceiver part.
Figure 6B:
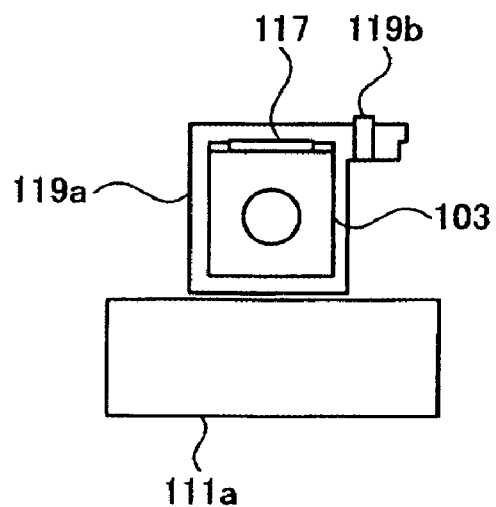
FIG. 6B is a diagram showing an optical transceiver part, which is viewed from the direction of the point of vision V4.

FIG. 6A is a diagram showing an example in which a fixing member 119a is provided for fixing the thermal conductive sheet 117 to the optical transceiver part 103. As shown in the figure, the thermal conductive sheet 117 is fixed to the optical transceiver part 103 with the fixing member 119a, which is provided separately from the fixing member 104 for fixing the optical transceiver part 103 to the housing 111a. In the example shown in the figure, the fixing member 119a surrounding the thermal conductive sheet 117 and the optical transceiver part 103 is riveted with a rivet 119b as shown in FIG. 6B, which is a view from the point of vision V4.

By fixing the thermal conductive sheet 117 to the optical transceiver part 103 with a separate member from the fixing member 104 for fixing the optical transceiver part 103 to the housing 111a in this way, the thermal conductive sheet 117 can be fixed to the optical transceiver part 103 under an optimum pressure.

Figure 7A:
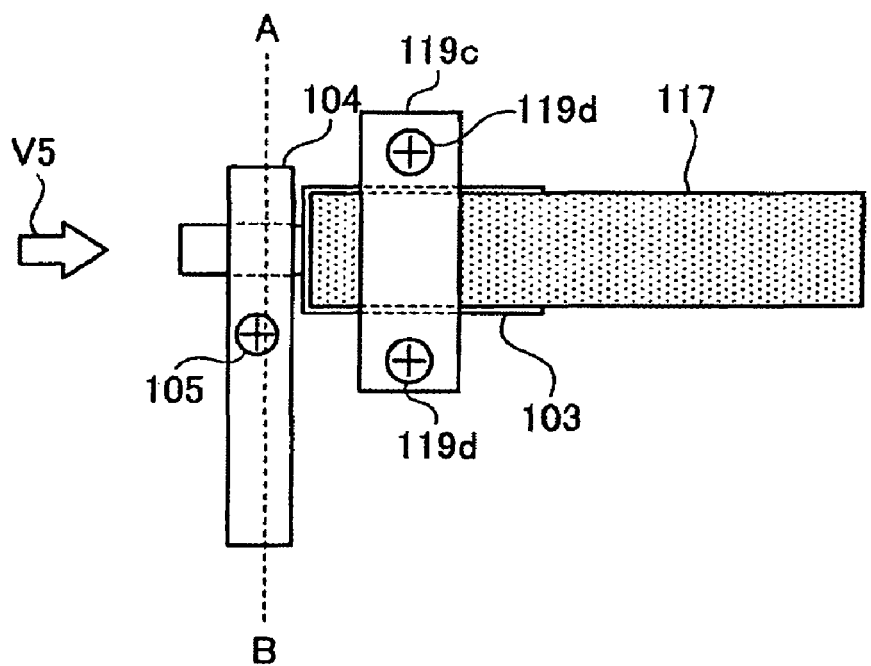
FIG. 7A is a diagram showing another example having a fixing member for fixing a thermal conductive sheet to an optical transceiver part.
Figure 7B:
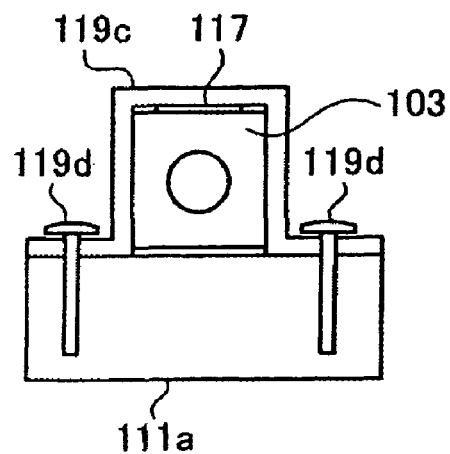
FIG. 7B is a diagram showing an optical transceiver part, which is viewed from the direction of the point of vision V5.

Notably, in order to fix the thermal conductive sheet 117 to the optical transceiver part 103 with a separate member from the fixing member 104 for fixing the optical transceiver 103 to the housing 111a, a structure is possible in which a fixing member 119c is screwed into the housing 111a with a screw 119d by holding the thermal conductive sheet 117 and the optical transceiver part 103, as shown in FIG. 7B, which is a view from the point of vision V5 of FIG. 7A.

Figure 8:
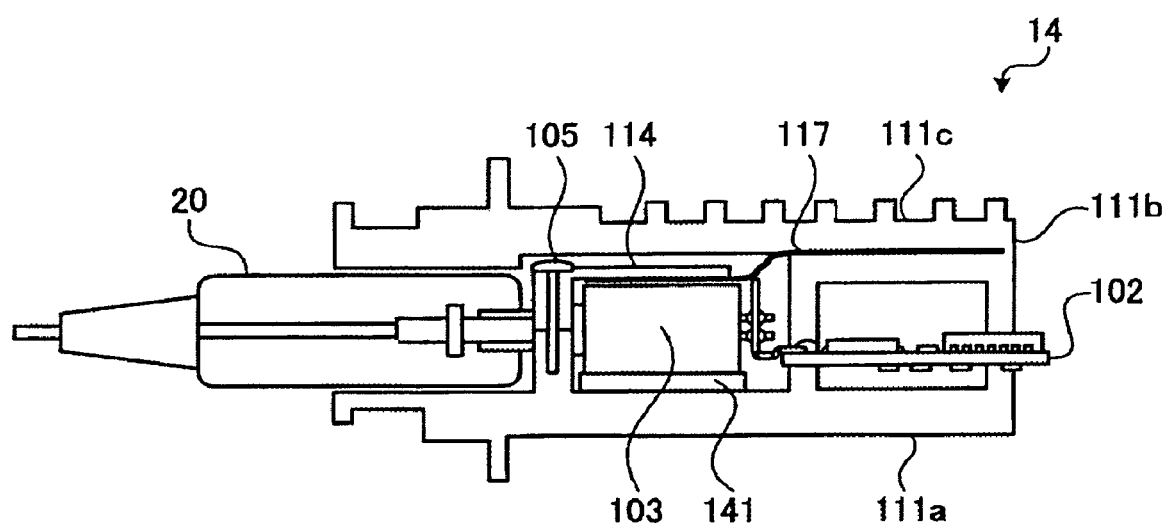
FIG. 8 is a diagram showing an example of the improvement of the degree of adhesion with a silicon sheet.
Figure 9A:
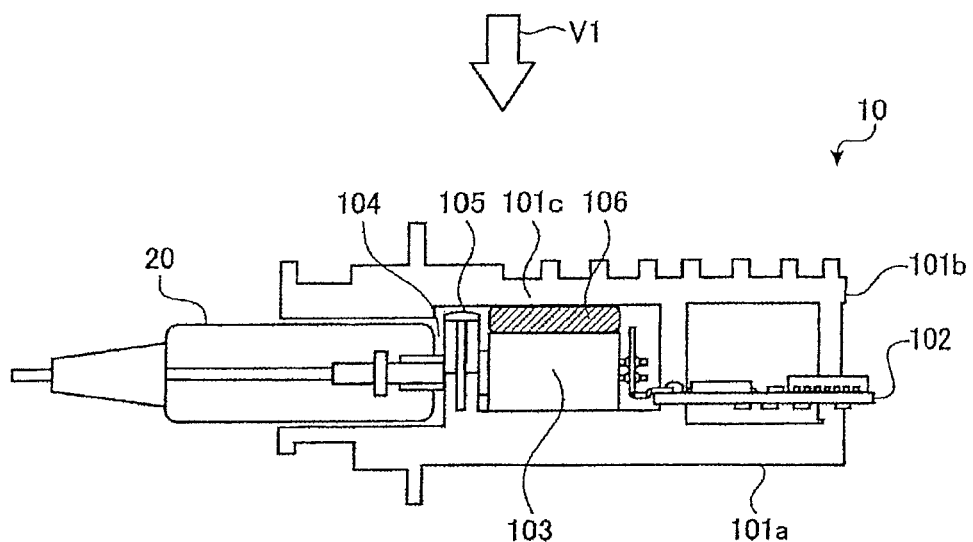
FIG. 9A is a diagram showing an example of the configuration of a conventional optical module.
Figure 9B:
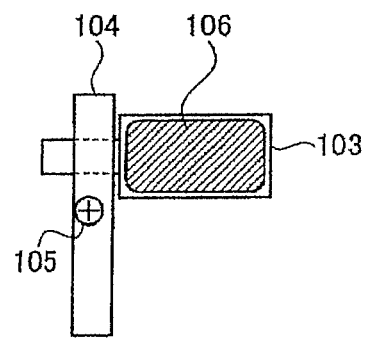
FIG. 9B is a diagram showing an optical transceiver part, which is viewed from the direction of the point of vision V1.

FIG. 8 is a diagram showing an example of the improvement of the degree of adhesion with a silicon sheet. An optical module 14 shown in the figure has a silicon sheet 141 between the housing 111a and the optical transceiver part 103. Since the silicon sheet 141 is elastic, the structure can improve the degree of adhesion between the optical transceiver part 103 and the thermal conductive sheet 117 by the fixing member 114, which can provide a good thermal conductivity.

Notably, the member for improving the degree of adhesion between the optical transceiver part 103 and the thermal conductive sheet 117 may be any of those excluding the silicon sheet 141 as far as it has a proper elasticity. The position where the silicon sheet 141 is to be sandwiched may be between the fixing member 114 and the cabinet cover 111b, for example.

As described above, since this embodiment is configured to transfer heat caused in an optical transceiver part to a radiating point by using a thermal conductive sheet, the heat caused in the optical transceiver part can be radiated efficiently, keeping the degree of freedom in design. Since this configuration provides a sufficient radiation effect without pressing the thermal conductive sheet against the optical transceiver part by applying strong pressure thereto, the occurrence of damage on the optical transceiver part and/or the displacement of the optical axis due to the application of pressure can be prevented.

As described above, an optical module and communication apparatus according to the present invention are useful for optical communication and particularly suitable for a case requiring implementation of stable operations by the optical module by performing efficient heat radiation of an optical transceiver part.

Advantages

According to as aspect of the embodiments, the heat generated in an optical transceiver part can be radiated efficiently, keeping the degree of freedom in design, since the heat generated in the optical transceiver part is transferred to a radiating point by using the thermal conductive sheet.

According to an aspect of the embodiments, the occurrence of damage and/or the displacement of the optical axis on a transceiver part due to application of pressure can be prevented since a sufficient radiation effect can be obtained without applying strong pressure to pressing the thermal conductive sheet against the optical transceiver part.

According to an aspect of the embodiments, the optical module can have a compact size since the folded thermal conductive sheet is in contact with the radiating point.

According to an aspect of the embodiments, the contact between the thermal conductive sheet and the optical transceiver part can be maintained even with application of tensile stress to the thermal conductive sheet since the thermal conductive sheet is fixed to the optical transceiver part with a convex thereof through the thermal conductive sheet.

According to an aspect of the embodiments, a damage and/or displacement of an optical axis on the optical transceiver part due to the pressure caused when the cabinets are assembled can be prevented since a space is provided between the cabinet of the optical module and the first fixing means to provide a pressure buffering effect.

According to an aspect of the embodiments, the heat caused in the optical transceiver part can be radiated highly efficiently since a graphite sheet having a high thermal conductivity is applied as the thermal conductive sheet.

With reference to the attached drawings, preferred embodiments of an optical module and communication apparatus according to the present invention will be described in detail below.

The turn of the embodiments isn't a showing the superiority and inferiority of the invention. Although the embodiments of the present inventions have been described in detail, it should be understood that the various changes, substitutions, and alterations could be made hereto without departing from the spirit and scope of the invention.

What is claimed is:

1. An optical module comprising:
    a case;
    an optical transceiver to perform one or both of transmission and reception of an optical signal, the optical transceiver being arranged in the case and having a cylindrical member thereon;
    a radiator to radiate heat of the optical transceiver to outside of the optical module, the radiator being arranged on the case;
    a thermal conductive sheet having a property of transferring heat to a surface direction and in the horizontal direction, and the thermal conductive sheet being elastic and having a first end and a second end;
    a first fixer to fix the first end of the thermal conductive sheet to the optical transceiver, the first fixer having a hole; and
    a second fixer to fix the second end of the thermal conductive sheet to a radiating point,
    wherein the cylindrical member of the optical transceiver is fitted into the hole of the first fixer so that the thermal conductive sheet is folded onto the optical transceiver.

2. The optical module of the claim 1, wherein the thermal conductive sheet has a fold part, the fold part between the first end and the second end.

3. The optical module of the claim 1 further comprising a space arranged between the case and the thermal conductive sheet.

4. The optical module of the claim 1 further comprising a driving circuit to drive the optical transceiver so as to communicate via an optical fiber connected to the optical transceiver.

5. The optical module of claim 1, wherein the thermal conductive sheet is a graphite sheet.

* * * * *